(12) United States Patent
Shereshevski et al.

(10) Patent No.: US 9,202,576 B2
(45) Date of Patent: Dec. 1, 2015

(54) NON-VOLATILE MEMORY DEVICE AND PROGRAMMING METHOD USING FEWER VERIFICATION VOLTAGES THAN PROGRAMMABLE DATA STATES

(71) Applicant: SAMSUNG ELECTRONICS CO., LTD., Suwon-si, Gyeonggi-do (KR)

(72) Inventors: Yoav Shereshevski, Ramat Gan (IL); Avner Dor, Ramat Gan (IL); Shmuel Dashevsky, Ramat Gan (IL); Jun Jin Kong, Yongin-si (KR); Pil Sang Yoon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 28 days.

(21) Appl. No.: 14/211,077

(22) Filed: Mar. 14, 2014

(65) Prior Publication Data

US 2014/0269057 A1   Sep. 18, 2014

(30) Foreign Application Priority Data

Mar. 15, 2013 (KR) ........................ 10-2013-0028265

(51) Int. Cl.
*G11C 16/04* (2006.01)
*G11C 16/10* (2006.01)
*G11C 11/56* (2006.01)
*G11C 16/34* (2006.01)

(52) U.S. Cl.
CPC ............ *G11C 16/10* (2013.01); *G11C 11/5628* (2013.01); *G11C 16/3459* (2013.01)

(58) Field of Classification Search
CPC . G11C 16/10; G11C 16/3459; G11C 11/5628
USPC ............ 365/185.03, 185.17, 185.19, 185.24, 365/185.33
See application file for complete search history.

(56) References Cited

U.S. PATENT DOCUMENTS

| 5,521,864 | A | 5/1996 | Kobayashi et al. |
| 6,807,102 | B2 | 10/2004 | Imamiya et al. |
| 7,596,031 | B2 | 9/2009 | Hemink et al. |
| 7,643,348 | B2 | 1/2010 | Cernea |
| 2008/0253181 | A1* | 10/2008 | Edahiro ............. G11C 16/3418 365/185.03 |
| 2009/0003055 | A1 | 1/2009 | Hwang |
| 2011/0103150 | A1 | 5/2011 | Chan et al. |
| 2011/0194346 | A1 | 8/2011 | Yoon et al. |
| 2011/0292724 | A1* | 12/2011 | Kim ................... G11C 16/0483 6/483 |

FOREIGN PATENT DOCUMENTS

KR   20110075312 A   7/2011

* cited by examiner

*Primary Examiner* — Tha-O H Bui
(74) *Attorney, Agent, or Firm* — Volentine & Whitt, PLLC

(57) ABSTRACT

A method of programming a non-volatile memory device includes; defining a set of verification voltages, setting a maximum verification voltage among verification voltages that are less than or equal to a first target programming voltage to be a target verification voltage, calculating a number of extra pulses based on the target verification voltage and the first target programming voltage, verifying whether a threshold voltage of the memory cell is equal to or greater than the target verification voltage by applying an incremental step pulse program (ISPP) pulse to the memory cell and then applying at least one verification voltage in the set of verification voltages to the memory cell, and further applying the ISPP pulse to the memory cell a number of times equal to the number of extra pulses when the threshold voltage is verified to be equal to or greater than the target verification voltage.

18 Claims, 17 Drawing Sheets

NON-VOLATILE MEMORY DEVICE AND PROGRAMMING METHOD USING FEWER VERIFICATION VOLTAGES THAN PROGRAMMABLE DATA STATES

CROSS-REFERENCE TO RELATED APPLICATIONS

This application claims the benefit of Korean Patent Application No. 10-2013-0028265 filed on Mar. 15, 2013, the subject matter of which is hereby incorporated by reference.

BACKGROUND

The inventive concept relates to non-volatile memory devices, and more particularly, to non-volatile memory devices having reduced programming periods while maintaining acceptable bit error rates (BER). The inventive concept also relates to methods of programming such non-volatile memory devices.

In certain conventional nonvolatile memory devices, such as flash memory, data is stored by defining the threshold voltage of a constituent memory cell. The definition (or adjusting) of a memory cell threshold voltage such that it falls within one of a number of defined threshold voltage distributions may be accomplished using a variety of programming methods. For example, in one class of programming methods, a sequence of high-voltage pulses having variable levels (e.g., sequentially increasing) is applied to the control gate of the memory cell in order to adjust its threshold voltage. Such programming methods are commonly referred to as "incremental-step pulse programming" or "ISPP".

Due to demands for greater data density, that is commercial pressure to store increasingly large amounts of data using smaller physical areas, certain conventional memory devices now make use of so-called "multi-level memory cells" (MLC) that are capable of storing two or more data bits per memory cell. However, while this approach is effective in providing increased data density, there are challenges involved in the programming of MLC. For example, adjacent memory cells coupling effects during multi-bit programming has an increased propensity to "disturb" (i.e., inadvertently change) data that has been previous programmed to a MLC.

Such coupling effects between adjacent (or proximate) memory cells may generally be reduced by the programming approaches that use a number of programming steps. However, the use of more programming steps to avoid coupling effects, increases the time required to program (i.e., the "programming period") the MLC. As has been conventionally determined, the number of programming steps used to program MLC may be reduced by the use of a so-called "pre-equalization programming techniques." Those skilled in the art understand that certain pre-equalization programming approaches essentially pre-compensate the threshold voltage of a memory cells during a programming operation in view of additional programming operations that will be applied to an adjacent (or proximate) memory cell.

Nonetheless, while certain conventional ISPP methods may be improved in their application by the use of pre-equalization programming techniques, the use of such pre-equalization programming techniques tends to drive up the number of verification voltages that must be used during program verification operations. This increased number of verification voltages and their application during program verification operations also inevitably increases the programming period associated with a programming operation.

SUMMARY

Certain embodiments of the inventive concept provide non-volatile memory devices and programming methods that are characterized by a reduced (or minimized) programming period and also a reduced bit error rate (BER) for data retrieved from constituent multi-level memory cells of the non-volatile memory device.

According to an aspect of the inventive concept, there is provided a method of programming a non-volatile memory device including; defining a set of verification voltages for a memory cell having a number of programmable data states, wherein a number of verification voltages in the set of verification voltages is less than a number of the programmable data states, setting a maximum verification voltage among verification voltages that are less than or equal to a first target programming voltage to be a target verification voltage, calculating a number of extra pulses based on the target verification voltage and the first target programming voltage, verifying whether a threshold voltage of the memory cell is equal to or greater than the target verification voltage by applying an incremental step pulse program (ISPP) pulse to the memory cell and then applying at least one verification voltage in the set of verification voltages to the memory cell, and further applying the ISPP pulse to the memory cell a number of times equal to the number of extra pulses when the threshold voltage is verified to be equal to or greater than the target verification voltage.

According to another aspect of the inventive concept, there is provided a non-volatile memory device including; a memory cell array including a plurality of multi-level memory cells (MLC), and an access circuit that receives information regarding a target verification voltage and a number of extra pulses during a program operation. The access circuit in response to the target verification voltage and the number of extra pulses, (1) verifies whether a threshold voltage of each MLC is equal to or greater than the target verification voltage by supplying an incremental step pulse program (ISPP) pulse, (2) applies at least one verification voltage among a set of verification voltages to each MLC, and (3) further applies the ISPP pulse to each MLC a number of times equal to the number of extra pulses when the threshold voltage is verified to be equal to or greater than the target verification voltage.

According to another aspect of the inventive concept, there is provided a non-volatile memory system including; a memory controller controlling the operation of a non-volatile memory device during a program operation, wherein the memory controller is configured to; define a set of verification voltages for a memory cell in the non-volatile memory device having a number of programmable data states such that a number of verification voltages in the set of verification voltages is less than a number of the programmable data states, set a maximum verification voltage among verification voltages that are less than or equal to a first target programming voltage to be a target verification voltage, calculating a number of extra pulses based on the target verification voltage and the first target programming voltage, and communicate information regarding the target verification voltage and the number of extra pulses to the non-volatile memory device; and wherein the non-volatile memory device is configured to verify whether a threshold voltage of the memory cell is equal to or greater than the target verification voltage by applying an incremental step pulse program (ISPP) pulse to the memory cell and then applying at least one verification voltage in the set of verification voltages to the memory cell, and further apply the ISPP pulse to the memory cell a number of times equal to the number of extra pulses when the threshold voltage is verified to be equal to or greater than the target verification voltage.

BRIEF DESCRIPTION OF THE DRAWINGS

Certain exemplary embodiments of the inventive concept are illustrated in relevant portion in the accompanying drawings in which.

DETAILED DESCRIPTION OF EMBODIMENTS

The inventive concept now will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
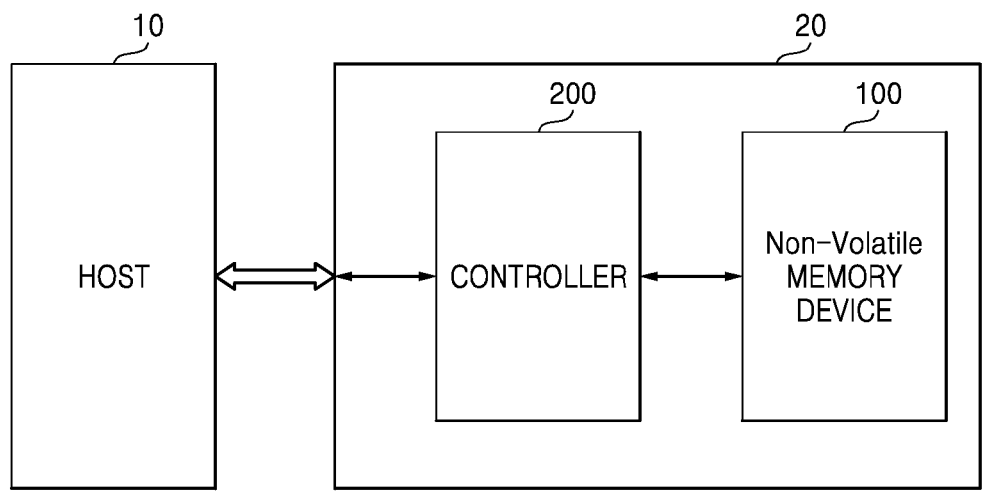
FIG. 1 is a block diagram illustrating a non-volatile memory system according to an embodiment of the inventive concept.

FIG. 1 is a block diagram illustrating a non-volatile memory system 20 according to an embodiment of the inventive concept. Referring to FIG. 1, the memory system 20 is connected to a host 10 and generally includes a memory controller 200 and a non-volatile memory device 100. The memory system 20 may be understood as any one of a number of different memory systems including at least one non-volatile memory device 100.

For descriptive purposes, it is assumed that non-volatile memory device 20 is a flash memory device incorporating at least some multi-level flash memory cells (MLC). Hence, the memory controller 200 may be used to generate an address and a command (e.g., a program command, a read command, or an erase command) for controlling a corresponding operation (e.g., a program operation, a read operation, or an erase operation) of the non-volatile memory device 100, wherein the program and read operations are respectively performed in page units, while the erase operation is performed in memory block units where each memory block includes a number of pages.

The memory controller 200 outputs a command for controlling the non-volatile memory device 100 to the non-volatile memory device 100. The non-volatile memory device 100 performs an operation according to the command, and transmits a result of performing the operation to the memory controller 200. The non-volatile memory device 100 and the memory controller 200 are connected via a bus, and exchange a command, data, a state signal, or the like via the bus.

In certain embodiments, the memory controller 200 and non-volatile memory device 100 may be connected via a plurality of channels, wherein each of the plurality of channels may be connected to a number of flash memory devices.

In certain embodiments, the memory controller 200 and non-volatile memory device 100 may be separately packaged in different physical packages, while in other embodiments the memory controller 200 and non-volatile memory device 100 may be commonly packaged.

Figure 2:
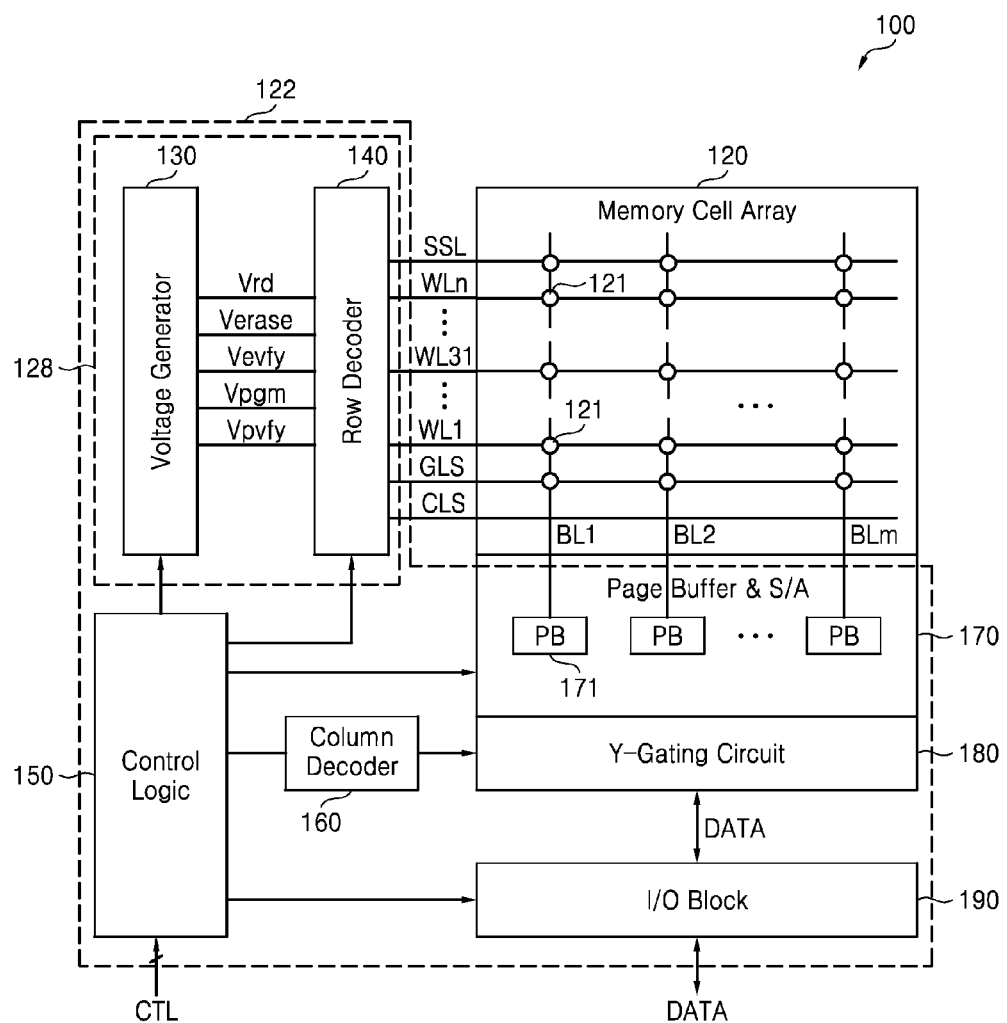
FIG. 2 is a block diagram further illustrating in one example the non-volatile memory device 100 of FIG. 1.

FIG. 2 is a block diagram further illustrating in one example the non-volatile memory device 100 of FIG. 1. Referring to FIG. 2, the non-volatile memory device 100 generally comprises a memory cell array 120 and related access circuitry 122 (hereafter, collectively and singularly referred to as access circuit 122).

It is assumed that memory cell array 120 includes a number of NAND flash memory cell strings respectively connected to bit lines. Each of the NAND memory cell strings includes a plurality of non-volatile memory cells connected in series. The access circuit 122 accesses the memory cell array 120 to perform data accessing (e.g., a program operation, a read operation, or an erase operation) according to a command (or command sets) and an address received from the outside, e.g., the memory controller 200.

The access circuit 122 includes a voltage generator 130, a row decoder 140, a control logic 150, a column decoder 160, a page register & sense amplifier block 170, a Y-gating circuit 180, and an input/output (I/O) block 190.

The voltage generator 130 may generate voltages for performing data accessing, based on control code generated by the control logic 150.

Specifically, the voltage generator 130 generates a programming voltage Vpgm and a programming verification voltage Vpvfy for performing a program operation, generates a read voltage Vrd for performing a read operation, and generates an erase voltage Verase and an erase verification voltage Vevfy for performing an erase operation, based on the control code, and outputs voltages for performing a desired operation among these voltages to the row decoder 140. For convenience of explanation, the programming verification voltage Vpvfy will be hereinafter referred to simply as 'verification voltage'. The control logic 150 controls overall operations of the access circuit 122 according to a control signal CTL received from the memory controller 200. For example, the control logic 150 may be used to control memory read state information sensed during a read operation, as well as read data to be output to the memory controller 200 as a result of the read operation.

Also, the control logic 150 may check whether an error is present in data read from a data register according to the command received from the memory controller 200, correct an error when the error is present in the read data, and output the error-corrected data to the memory controller 200 so that the error-corrected data may be output to the host 10.

The column decoder 160 outputs a plurality of selection signals to the Y-gating circuit 180 by decoding column addresses YADD, under control of the control logic 150. The page register & sense amplifier block 170 includes a plurality of page buffers PB 171. The plurality of page buffers PB 171 are connected to a plurality of bit lines, respectively.

During a read operation, each of the plurality of page buffers PB 171 may be used to temporarily store data read from the memory cell array 120, under control of the control logic 150. Each of the plurality of page buffers PB 171 may be embodied as a two or more stage buffer or latch. Thus, the page register & sense amplifier block 170 may perform reading data from the memory cell array 120 and outputting data to the I/O block 190 in parallel. Also, the plurality of page buffers PB 171 may operate as sense amplifiers that respectively sense and amplify voltages of the plurality of bit lines during a read operation, under control of the control logic 150. Exemplary structure of each page buffer PB 171 will be described in some additional detail with reference to the respective embodiments illustrated in FIGS. 8 and 9 hereafter.

The Y-gating circuit 180 may be used to control transmission of data between the page register & sense amplifier block 170 and the I/O block 190 according to a plurality of selection signals received from the column decoder 160.

The I/O block 190 may be used to communicate externally provided data to the Y-gating circuit 180, or to communicate data received from the Y-gating circuit 180 to the memory controller 200 via a plurality of I/O pins (or data bus).

Figure 3:
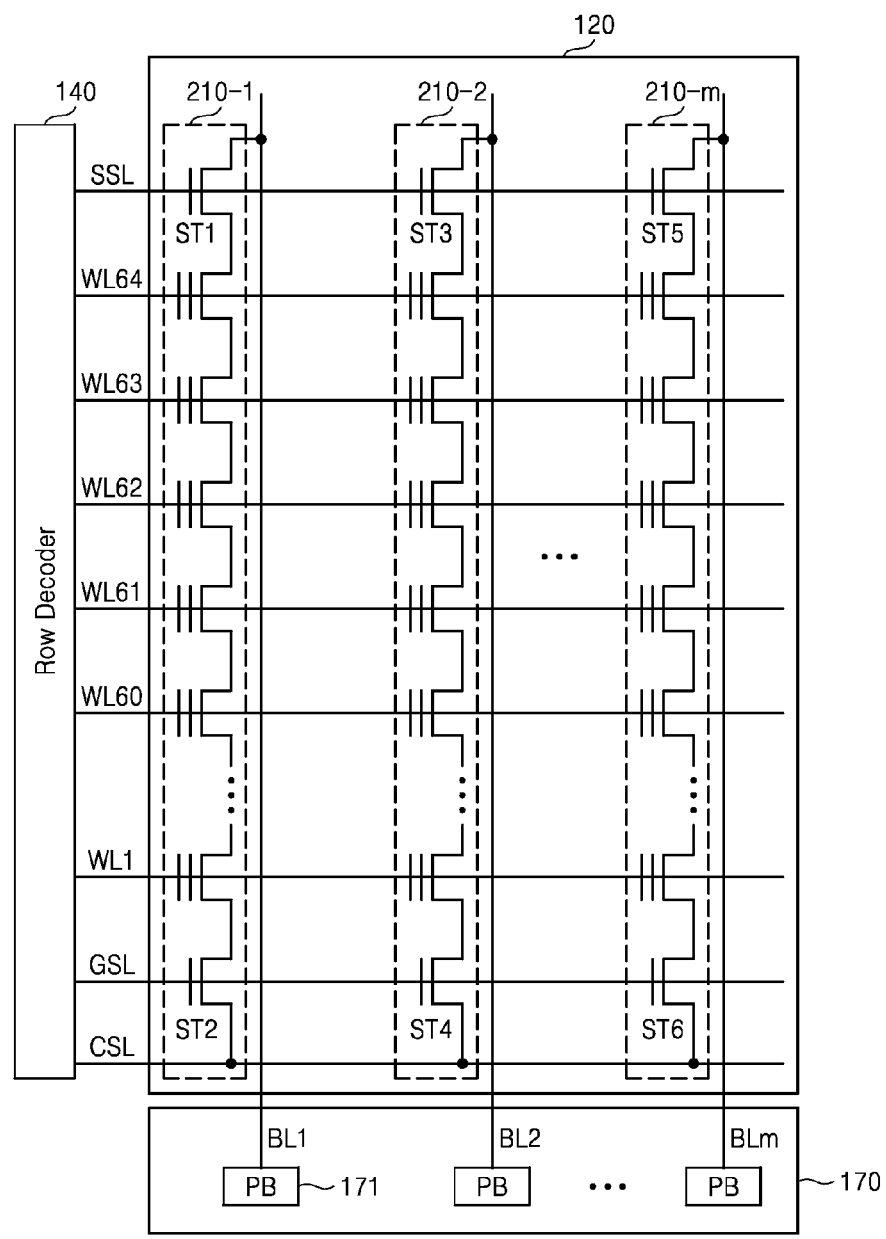
FIG. 3 is a partial block diagram further illustrating in one two-dimensional (2D) example the memory cell array 120 of FIG. 2.

FIG. 3 is a partial block diagram further illustrating in a two-dimensional (2D) example the memory cell array 120 of FIG. 2 according to an embodiment of the inventive concept. As illustrated in FIG. 3, the memory cell array 120 may include a plurality of NAND memory cell strings 210-1, 210-2, . . . , and 210-m, wherein 'm' is a natural number. Each of the plurality of NAND memory cell strings 210-1, 210-2, . . . , and 210-m includes a plurality of non-volatile memory cells connected in series. Here, it is assumed that each of the NAND memory cell strings 210-1, 210-2, . . . , and 210-m is arranged during fabrication in essentially two dimensions (i.e., according to a single X-Y fabrication plane).

The NAND memory cell string 210-1 includes a first selection transistor (or string selection transistor) ST1 connected to a bit line BL1, a second selection transistor (or ground selection transistor) ST2 connected to a common source line CSL, and a plurality of non-volatile memory cells connected in series between the first selection transistor ST1 and the second selection transistor ST2.

The gate of the first selection transistor ST1 is connected to a string selection line SSL. Respective gates of the plurality of non-volatile memory cells are connected to a plurality of word lines WL1 to WL64, respectively. The gate of the second selection transistor ST2 is connected to a ground selection line GSL.

The structures of the other NAND memory cell strings 210-2, 210-3, . . . , and 210-m may be assumed to be substantially the same as that of the NAND memory cell string 210-1.

Figure 4:
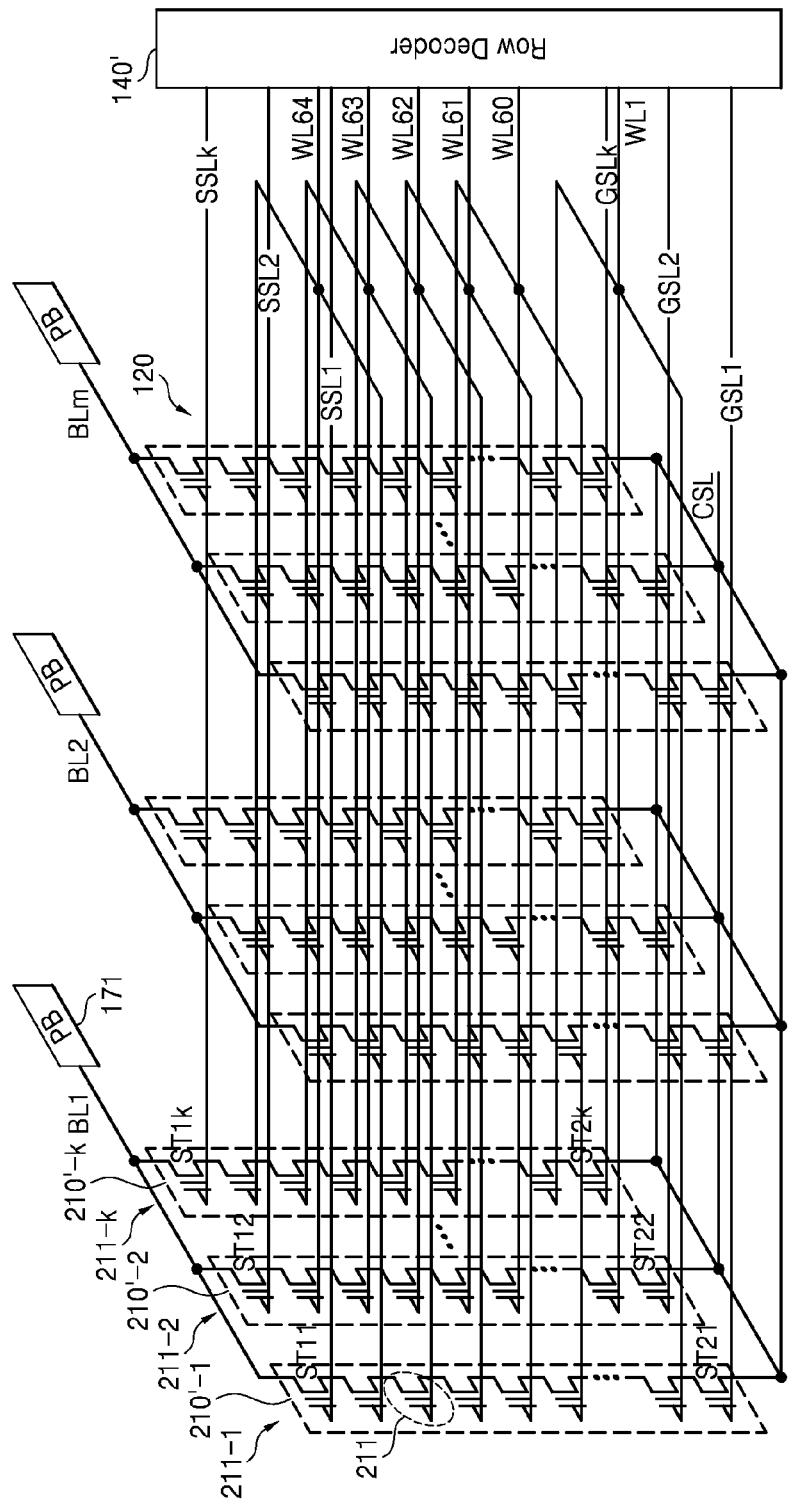
FIG. 4 is a partial block diagram further illustrating in one three-dimensional (3D) example the memory cell array 120 of FIG. 2.

Although for convenience of explanation, 64 word lines WL1 to WL64 are illustrated in FIGS. 3 and 4, the inventive concept is not limited thereto and the number of word lines may be any integer greater than 1.

Although not shown, the memory cell array 120 may further include at least one dummy word line.

As noted above, each of the plurality of non-volatile memory cells included in each of the NAND memory cell strings 210-1 to 210-m may be embodied as a flash electrically erasable programmable read-only memory (EEPROM) capable of storing one or more bits.

Thus, each of the plurality of non-volatile memory cells may be embodied as a NAND flash memory cell capable of storing one or more bits (e.g., a single-level cell (SLC) or a multi-level cell (MLC)).

FIG. 4 is a partial block diagram further illustrating in a three-dimensional example the memory cell array 120 of FIG. 2 according to an embodiment of the inventive concept. As illustrated in FIG. 4, NAND memory cell strings 210'-1, 210'-2, . . . , and 210'-k may be three-dimensionally arranged on different planes, wherein 'k' is a natural number. In this case, an access circuit (not shown) capable of accessing the NAND memory cell strings 210'-1, 210'-2, . . . , and 210'-k may be shared.

As illustrated in FIG. 4, the first NAND memory cell string 210'-1 may be three-dimensionally disposed on a first layer 211-1, the second NAND memory cell string 210'-2 may be three-dimensionally disposed on a second layer 211-2 which is different from the first layer 211-1, and the $k^{th}$ NAND memory cell string 210'-k may be three-dimensionally disposed on a layer 211-k which is different from the second layer 211-2.

The plurality of layers 211-1 to 211-k may be formed by stacking wafers, chips, or cells. The plurality of layers 211-1 to 211-k may be connected via through-silicon vias (TSVs), bumps, or wire bonding. Each of the plurality of layers 211-1 to 211-k includes a plurality of cell strings.

The first NAND memory cell string 210'-1 disposed on the first layer 211-1 includes a plurality of selection transistors ST11 and ST21, and a plurality of non-volatile memory cells, e.g., NAND flash memory cells, which are connected in series between the plurality of selection transistors ST11 and ST21.

The second NAND memory cell string 210'-2 disposed on the second layer 211-2 includes a plurality of selection transistors ST12 and ST22, and a plurality of non-volatile memory cells, e.g., NAND flash memory cells, which are connected in series between the plurality of selection transistors ST12 and ST22.

The $k^{th}$ NAND memory cell string 210'-k disposed on the $k^{th}$ layer 211-k includes a plurality of selection transistors ST1k and ST2k, and a plurality of non-volatile memory cells, e.g., NAND flash memory cells, which are connected in series between the plurality of selection transistors ST1k and ST2k.

As illustrated in FIG. 4, the NAND memory cell strings 210'-1, 210'-2, . . . , 20'-k may share a plurality of word lines WL1 to WL64, a common source line CSL, and a bit line BL1. In other words, the NAND memory cell strings 210'-1, 210'-2, . . . , and 210'-k disposed on corresponding locations on the layers 211-1 to 211-k, respectively, may be connected to a plurality of page buffers 171 included in a page buffer & sense amplifier block 170, respectively. In the present disclosure, the memory cell array 120 may be understood comprehensively as the 2D memory cell array 120 of FIG. 3 and the 3D memory cell array 120' of FIG. 4.

Figure 5:
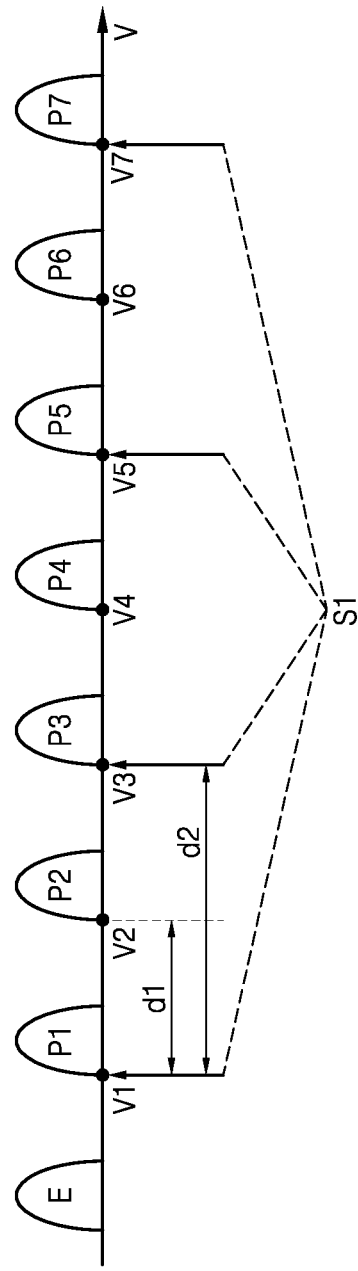
FIG. 5 is a conceptual diagram illustrating certain verification voltages that may be used in an embodiment of the inventive concept.

FIG. 5 illustrates an approach wherein a selected "set" of verification voltages is defined according to an embodiment of the inventive concept. Referring to FIG. 5, a 3-bit triple-level cell (TLC) capable of being placed (programmed or erased) in one of eight (8) possible data states, wherein each data state has a corresponding threshold voltage distribution including an erased state E and seven programmed states P1, P2, . . . , and P7. Conventionally, in order to verify the currently programmed state of a 3-bit TLC, up to seven (7) verification voltages V1, V2, . . . , and V7 (or a number equal to the number of the programmed states P1 to P7) must be used. In contrast, according to certain embodiments of the inventive concept, only a selected set of verification voltages is defined from a full set of possible verification voltages. That is, in the illustrated example of FIG. 5 verification voltages V1, V3, V5, and V7 are included in a "set" (S1) selected from a "full set" of possible verification voltages V1, V2, V3, V4, V5, V6, and V7 (hereafter, "V1 to V7"), each one of which corresponds to a programmed state P1, P2, P3, P4, P5, P6 and P7 (hereafter, "P1 to P7"). As a result, the number of verification voltages included in any selected "set" must be less than the number of data programmed states.

Further, any two of the closest "set verification voltages" (e.g., V1, V3, V5, and V7) will be spaced apart by at least a "set verification voltage interval" (d2) that is greater than a "full set verification voltage interval" (d1) that separates adjacent verification voltages in the full set of verification voltages. The illustrated set verification voltage interval d2 may be defined to be greater than the full set verification voltage interval d1 between adjacent programming voltages V1 to V7. However, the inventive concept is not limited thereto. That is, the respective intervals between closest (or "adjacent") set verification voltages need not be the same, and the particular set verification voltages to be included in a given verification voltage set S1 may be variously selected. That is, different approaches may be taken to the selection of set verification voltages.

Information regarding set verification voltages may be stored in the memory controller 200 and provided to the non-volatile memory device 100 during a program operation. The memory controller 200 may include one or more computational routines capable of defining set verification voltages in accordance with memory system performance and data to be stored and/or retrieved.

For example, the non-volatile memory device 100 may include an e-fuse circuit, wherein the state of the e-fuse may be used to indicate information regarding a set verification voltage. The e-fuse may be embodied as a separate register included in the access circuit 122 or may be embodied as a logical part of the memory cell array 120.

Figure 6:
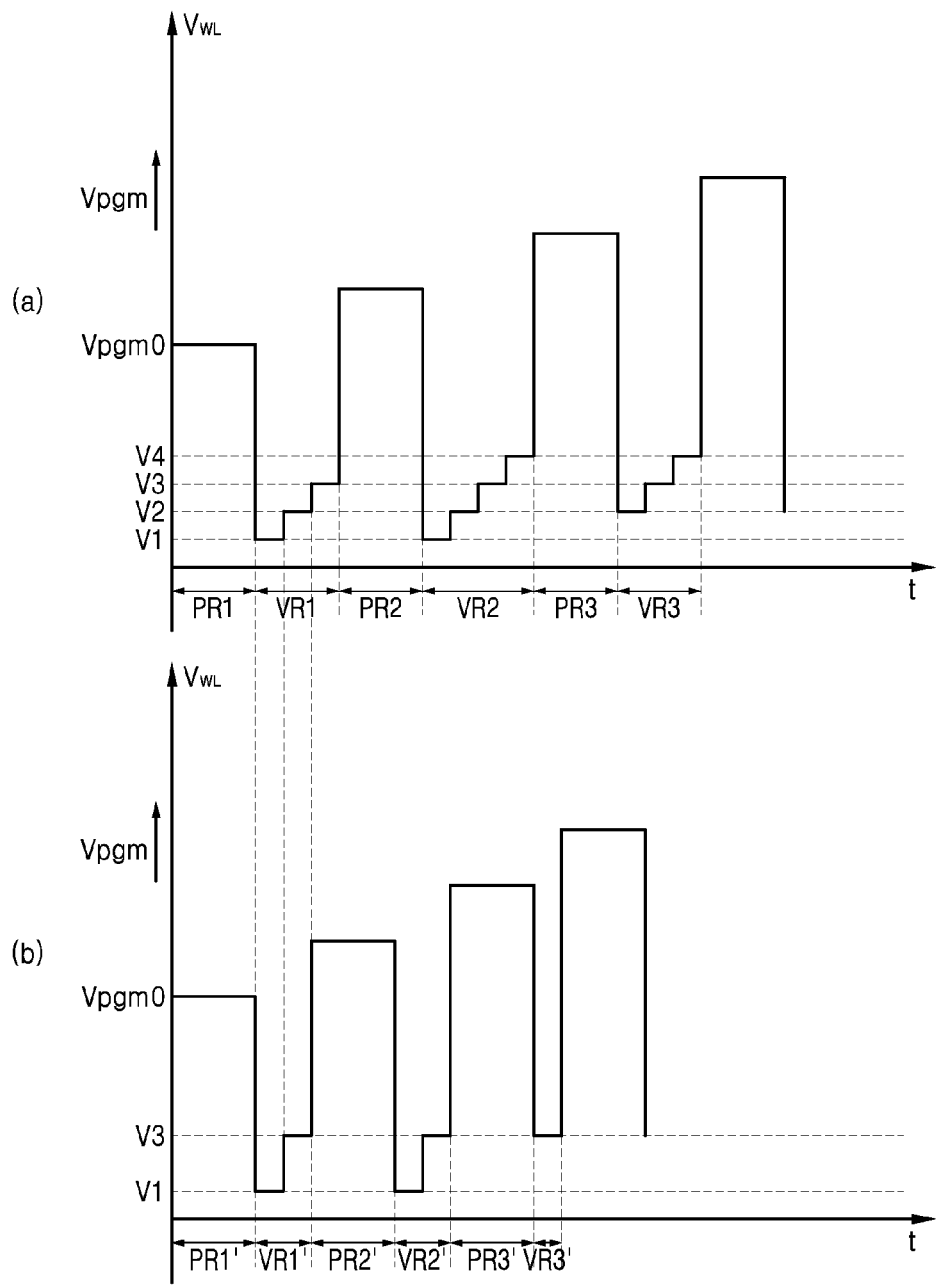
FIG. 6, inclusive of FIGS. 6(*a*) and 6(*b*), are comparative graphs illustrating voltages applied to the gate of a memory cell during a program operation according to an embodiment of the inventive concept.

FIG. 6, inclusive of FIGS. 6(a) and 6(b), compares verification voltages applied to the gate of a memory cell during different program operations. Specifically, FIG. 6(a) illustrates gate voltages applied when verification is conventionally performed using each and every one of a full set verification voltages V1, V2, . . . , and V7. In contrast, FIG. 6(b) illustrates gate voltages applied when verification is performed using a defined verification voltage set S1 according to an embodiment of the inventive concept.

Referring to FIG. 6(a), during a first cycle (or loop) of a programming operation, a programming voltage Vpgm having an initial voltage level Vpgm0 is applied to the control gate of a memory cell via a word line. Successive loops of the programming operation variously applied incrementally stepped versions of the programming voltage Vpgm in a pulse sequence. The application of the programming voltage pulse sequence to the gate of the memory cell being programmed added electrical charge to the floating gate thereof, thereby adjusting the threshold voltage of the memory cell.

Between successive loops applying these increasing pulses, the actual state of the memory cell threshold voltage may be determined via one or more verification operations. Here, it is assumed that the threshold voltage of the memory cell being programmed is less than a verification voltage V4 following application of a first programming pulse during a first programming period PR1, and is less than a verification voltage V5 following application of a second programming pulse during a second programming period PR2, and therefore a third programming pulse is applied during a third programming period PR3. It is also assumed that the threshold voltage of the memory cell is at least equal to a verification voltage V1 after each of the first, second and third programming periods (PR1 to PR3).

Under these assumptions, when verification is performed using each and every one of the full verification voltage set (V1, V2, . . . , and V7) according to the conventional approach, discrete verification operations must be performed using the verification voltages V1, V2, and V3 during a first verification period VR1 following the first programming voltage pulse. Similarly, discrete verification operations must be performed using the voltages V1, V2, V3, and V4 during a second verification period VR2 following the second programming pulse. Finally, discrete verification operations must be performed using the voltages V2, V3, and V4 during the third verification period VR3 following the third programming pulse.

Referring to FIG. 6(b), however, when verification is performed using the defined verification voltage set S1 including verification voltages V1, V3, V5, and V7, verification is performed using only the voltages V1 and V3 among the voltages V1, V2, and V3 during a first verification period VR1', verification is performed using only the voltages V1 and V3 among the voltages V1, V2, V3, and V4 during the second verification period VR2', and verification is performed using only the voltage V3 among the voltages V2, V3, and V4 during the third verification period VR3'. Accordingly, the respective durations of the respective verification period are reduced, thereby shortening the overall time required to program the memory cell.

Extending the foregoing general example, a programming method according to an embodiment of the inventive concept will now be described according to several values defined below. Those skilled in the art will, however, recognize that such definition processes are merely exemplary.

During a given ISPP approach, a particularly defined programming pulse sequence having a selected step increase will be supplied to the control gate of memory cells connected to a word line. A voltage difference between two continuous pulses may be set by a user to be a constant. Thus, if V(k,p) indicates the threshold voltage of a "$k^{th}$" memory cell following application of "p" programming pulses, then a mathematical model for the ISPP may be expressed by Equation 1 below $$V(k,p)=V(k,p-1)+\alpha(k,p)$$

$$V(k,0)=\beta(k),$$

wherein '$\alpha(k,p)$' denotes the inclination of the threshold voltage of the $k^{th}$ cell with respect to a $p^{th}$ pulse, '$\beta(k)$' denotes an initial threshold voltage before a first pulse is supplied, 'L' denotes a number of verification voltages included in a set of verification voltage set S1, 'Vref(n)' denotes an $n^{th}$ verification voltage arranged in an increasing manner such that Vref(k1)>Vref(k2) for any k1>k2, and 'X(k)' denotes a first target programming voltage of the $k^{th}$ cell. In the foregoing, n=1, ..., L.

Thus, a particular set of verification voltages S1 may be used to verify whether the threshold voltage of the $k^{th}$ cell is beyond (i.e., is greater than) verification voltages, wherein according to the mathematical model of ISPP expressed in Equation 1, a threshold voltage V(k,p) of the $k^{th}$ cell may be calculated using the inclination of the threshold voltage '$\alpha(k,p)$' and the initial threshold voltage '$\beta(k)$'. Thus, certain verification voltages in a full set of verification voltages may not needed. When the $k^{th}$ cell is programmed using a first programming voltage X(k), a value n(k) satisfying Equation 2 below is calculated by $$n(k) = \underset{t}{\mathrm{argmin}} \left| \beta(k) + \sum_{i=1}^{t} \alpha(k,i) - X(k) \right|,$$

wherein, 'argmin' denotes a value '1' when an absolute value of Equation 2 is a minimum value. That is, 'n(k)' denotes the number of pulses supplied when the threshold voltage V(k,p) most approximates to the first target programming voltage X(k). In this case, programming of the $k^{th}$ cell is completed simply by supplying n(k) pulses to the $k^{th}$ cell and causing the $k^{th}$ cell to be in an inhibit state. In the above method, pulses are supplied by predicting the number of needed pulses without performing a verification process. Thus, this method is referred to as prediction programming or open loop programming.

Thus, the inclination of a threshold voltage will vary according to a value p and with respect to different cells. The inclination of the threshold voltage $\alpha(k,p)$ and the initial threshold voltage $\beta(k)$ of each cell may be estimated based on Equation 3 below.

$$\hat{\alpha}(k,p) = \tilde{V}(k,p) - \tilde{V}(k,p-1)$$

$$\tilde{\beta}(k) = \tilde{V}(k,p) - \sum_{i=1}^{p} \hat{\alpha}(k,i),$$

wherein $\tilde{V}(k,p)$ denotes a read threshold voltage of the $k^{th}$ cell after p pulses are supplied, and a tilde '˜' is used to indicate that noise is added to the read threshold voltage since noise is added when a threshold voltage is read.

To simplify the suggested calculation, it is assumed that the inclination of the threshold voltage $\alpha(k,p)$ is a constant, and $\alpha(k,p)$ will be described simply as '$\alpha$'. The inclination of the threshold voltage $\alpha$ may be beforehand estimated based on values measured in several blocks.

Equation 2 above reveals that the greater the first programming voltage X(k), the more augends $\alpha(k,i)$, the greater the dispersion of an estimated error in the number n(k) of pulses supplied. This means that more noise is contained in a programmed voltage. To reduce the augends, a target verification voltage Vref(m(X)) is used.

Figure 7:
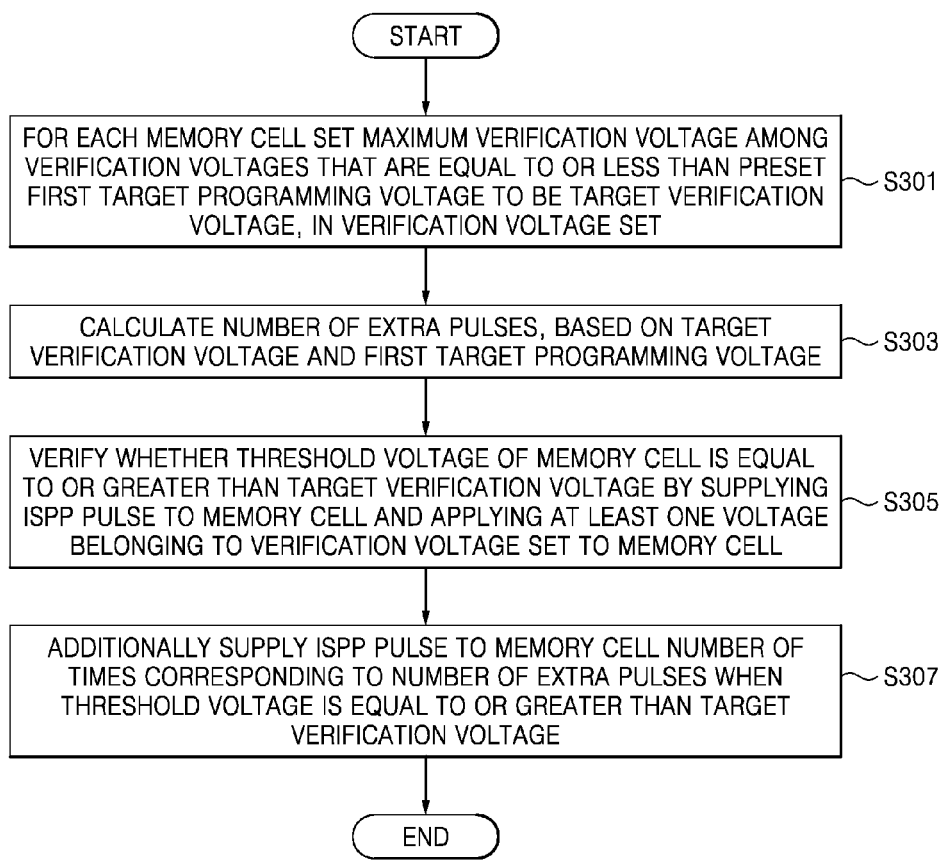
FIG. 7 is a flowchart summarizing in one example a programming method according to an embodiment of the inventive concept.

FIG. 7 is a flowchart summarizing in one example a programming method according to an embodiment of the inventive concept. Referring collectively to FIGS. 1, 5, and 7, first, an ISPP voltage is initialized, and then the operations described below are performed.

In a set of verification voltages S1 including verification voltages V1, V3, V5, and V7, a maximum verification voltage among the verification voltages that is equal to or less than a preset first target programming voltage X(k) is set to be a target verification voltage Vref(m(X)) (S301). In this case, 'm(X)' denotes a maximum value when an $m^{th}$ verification voltage is equal to or less than the first target programming voltage X(k), and may be expressed by Equation 4 below.

$$m(X)=\max\{m|V_{ref}(m)\leq X\}$$

The first target programming voltage X(k) may be set to be lower than a second target programming voltage T(k) that is preset based on a coupling coefficient γw between word lines and a coupling coefficient γb between bit lines, as will be described in detail with reference to Equation 6 below.

Then, the number of extra pulses Nextra is calculated based on the target verification voltage Vref(m(X)) and the first target programming voltage X(k) (S303). In this case, the number of extra pulses Nextra may be calculated by Equation 5 below.

$$N_{extra} = \mathrm{round}\left(\frac{X - V_{ref}(m(X))}{\alpha}\right).$$

Equation 5 may be obtained by replacing '$\beta(k)$' with 'Vref(m(X))' expressed in Equation 2 and approximating '$\alpha(k,p)$' to '$\alpha$'.

Then, whether a threshold voltage of a memory cell is equal to or greater than the target verification voltage Vref(m(X)) is verified by supplying the ISPP pulse to the memory cell and applying at least one voltage belonging to the verification voltage set S1 to the memory cell (S305).

If the threshold voltage of the memory cell is equal to or greater than the target verification voltage Vref(m(X)), the ISPP pulse is additionally applied to the memory cell a number of times corresponding to the number of extra pulses Nextra (S307). The threshold voltage of the memory cell does not need to be verified when the ISPP pulse is additionally supplied thereto. In other words, verification is not performed between the supplying of the ISPP pulse and the supplying of the ISPP pulse.

After the ISPP pulse is additionally supplied the number of times corresponding to the number of extra pulses Nextra, the memory cell is set to be in an inhibit state. Thus, the memory cell may not be further programmed, and the other memory cells connected to a word line to which the memory cell belongs may be programmed.

Figure 8:
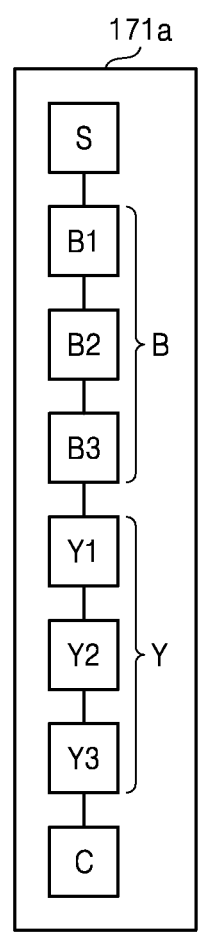
FIG. 8 is a block diagram further illustrating in one example (171*a*) the page buffer 171 of FIGS. 2, 3 and 4 according to an embodiment of the inventive concept.

FIG. 8 is a block diagram further illustrating in one example (171a) the page buffer 171 of FIGS. 2, 3 and 4 according to an embodiment of the inventive concept. Referring to FIGS. 2 and 8, the page buffer 171a may include a sensing latch S, a plurality of data storing latches B, at least one extra pulse number storing latch Y, and a cache latch C.

To temporarily store data, the sensing latch S and the cache latch C are connected to the memory cell array 120 and the I/O block 190, respectively.

Each of the data storing latches B may store bit data corresponding to one of the target verification voltage Vref(m (X)) of the memory cells 121. The number of the data storing latches B may be equal to the number of bits stored in each of the memory cells 121. The number of the data storing latches B may be 'ceil($\log_2$(M))', where 'M' denotes the number of states that the memory cell may have. The memory cell may have either a plurality of programmed states or an erase state. In this case, 'cell' denotes a minimum integer that is equal to or greater than a predetermined number. That is, in the case of a 3-bit TLC, since M=8, three data storing latches B1, B2, and B3 may be used as the data storing latches B as illustrated in FIG. 8.

The at least one extra pulse number storing latch Y stores the number of extra pulses Nextra needed to program the memory cells 121 according to a open loop. The number of the at least one extra pulse number storing latch Y is determined by the size K of a set of values that the number of extra pulses may have. The number of the at least one extra pulse number storing latch Y may be 'ceil($\log_2$(K))'. For example, if K=6, the at least one extra pulse number storing latch Y may include three extra pulse number storing latches Y1, Y2, and Y3 as illustrated in FIG. 8, but the inventive concept is not limited thereto.

Figure 9:
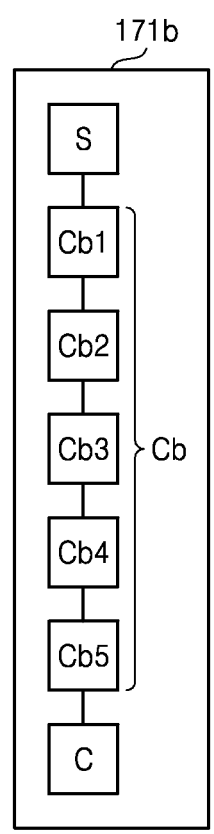
FIG. 9 is a block diagram further illustrating in another example (171*b*) the page buffer of FIGS. 2, 3 and 4 according to another embodiment of the inventive concept.

FIG. 9 is a block diagram further illustrating in another example (171b) the page buffer 171 of FIGS. 2, 3 and 4 according to another embodiment of the inventive concept.

In FIG. 9, functions of a sensing latch S and a cache latch C are the same as those of the sensing latch S and the cache latch C illustrated in FIG. 8 and are thus not described here again.

In FIG. 8, bit data corresponding to the target verification voltages Vref(m(X)) of the memory cells 121 and the number of extra pulses Nextra are stored in the plurality of data storing latches B and the at least one extra pulse number storing latch Y, respectively. However, as illustrated in FIG. 9, in the page buffer 171b, bit data corresponding to the target verification voltages Vref(m(X)) of the memory cells 121 and a value based on the number of extra pulses Nextra may be stored in a plurality of combination storing latches Cb.

The number of the combination storing latches Cb is determined by the size L of a verification voltage set and the size K of a set of values that the number of extra pulses Nextra may have. The number of the combination storing latches Cb may be 'ceil($\log_2$(LK))'. For example, when K=6 and L=5, five combination storing latches Cb1 to Cb5 may be used as the combination storing latches Cb, as illustrated in FIG. 9.

As described above, the combination storing latches Cb may be embodied as five latches when K=6, L=5, and M=8. However, according to another embodiment of the inventive concept, less than five latches may be used. In other words, the number of latches may vary according to an embodiment of the inventive concept.

For example, it is assumed that the set of verification voltages S1 includes five verification voltages V1, V2, V3, V4, and V5. It is assumed that among the five verification voltages V1, V2, V3, V4, and V5, the number of extra pulses Nextra may be '0' or '1' in the case of the first and second verification voltages V1 and V2, may be '0', '1', or '2' in the case of the third and fourth verification voltages V3 and V4, and may be '1', '2', '3', '4', or '5' in the case of the fifth verification voltage V5.

In this case, information regarding verification voltages and the number of extra pulses may be expressed as shown in Table 1 below.

TABLE 1

| Index | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Verification voltage | V1 | V1 | V2 | V2 | V3 | V3 | V3 | V4 | V4 | V4 | V5 | V5 | V5 | V5 | V5 | V5 |
| Extra pulse | 0 | 1 | 0 | 1 | 0 | 1 | 2 | 0 | 1 | 2 | 0 | 1 | 2 | 3 | 4 | 5 |

In Table 1, if a number of cases that the target verification voltage Vref(m(X)) and the number of extra pulses Nextra may have is 'Z', then Z=16. In this case, in order to represent all of numbers of cases, only 'ceil($\log_2$(Z))' bits are needed. Thus, the number of the combination storing latches Cb may be four. In this case, the memory cell array 120 or the access circuit 122 may additionally store information regarding combinations of a number of cases that the target verification voltage Vref(m(X)) and the number of extra pulses Nextra may have.

The verification voltage set S1 may be set according to an optimum algorithm such that the number of cases 'Z' is minimized. Thus, the number of latches may be minimized. In this case, the verification voltage set S1 may be set such that the more verification voltages are selected among low voltages.

For example, the set of verification voltages S1 may include {V1, V2, V4, V6}.

A method of setting a first target programming voltage X(k) of a $k^{th}$ cell connected to a word line to be programmed (hereinafter referred to as a 'current word line') will now be described.

According to coupling effects, the threshold voltage of a memory cell changes with to a change in the threshold voltages of adjacent (or proximate) memory cells. Such a memory cell being influenced by a change in the threshold voltages of adjacent memory cell(s) will be referred to as a "victim cell", while the adjacent memory cell will be referred to as an "aggressor cell". If memory cells at the edges of the memory cell array 120 are ignored, each constituent memory cell will have eight (8) adjacent of neighboring cells. Here, the eight neighboring cells include two (2) vertically disposed memory cells belonging to the same bit line, two (2) horizontally disposed memory cells belonging to the same word line, and four (4) diagonally disposed memory cells. The coupling effect may be modeled as a linear combination of variations in the threshold voltages of all neighboring memory cells. Coefficients of the linear combination are referred to as coupling coefficients. It is assumed horizontal cells have the same coupling coefficient, vertical cells have the same coupling coefficient, and diagonal cells have the same coupling coefficient. The three coupling coefficients and other parameters will now be defined.

'$\gamma_b$' denotes a coupling coefficient between bit lines with respect to one word line. '$\gamma_w$' denotes a coupling coefficient between word lines with respect to one bit line. '$\gamma_d$' denotes a coupling coefficient between diagonal cells. Since the coupling coefficient $\gamma_d$ is very small and is thus neglectable, compared to the coupling coefficients '$\gamma_b$' and '$\gamma_w$', the coupling coefficient $\gamma_d$ will not be considered in calculation that will be described below.

'T(k)' denotes a target threshold voltage that a $k^{th}$ cell connected to a current word line after programming of the memory cell array 120 is completed. However, according to an embodiment of the inventive concept, when the $k^{th}$ cell is programmed a number of times, 'T(k)' may be set to be a target threshold voltage of the cell when programming of the cell is completed at least once among the number of times. 'T(k)' will be hereinafter referred to as a second target programming voltage. For example, in the case of a TLC, the second target programming voltage T(k) may have one of eight values including seven programming voltages and one erase voltage.

'$T^{next\ line}(k)$' denotes a target threshold voltage of a $k^{th}$ cell connected to a word line subsequent to the current word line when the programming of the memory cell array 120 is completed. That is, the target threshold voltage '$T^{next\ line}(k)$' is the same as the target threshold voltage T(k) except that the target threshold voltage '$T^{next\ line}(k)$' is the target threshold voltage of the $k^{th}$ cell connected to the subsequent word line. The greater the target threshold voltage $T^{next\ line}(k)$, the greater the coupling effect induced in the $k^{th}$ cell connected to the current word line during programming of the subsequent word line.

'Vt1(k)' denotes a target threshold voltage of the $k^{th}$ cell connected to the current word line, after the current word line is programmed and before the subsequent word line is programmed. When the subsequent word line is programmed, the threshold voltage of the $k^{th}$ cell connected to the current word line changes from vt1(k) to T(k) due to a coupling occurring in a vertical direction.

'X(k)' denotes a target threshold voltage of the $k^{th}$ cell connected to the current word line before the current word line is programmed. When the number of bit lines is 65536, 'k' may be an integer between '0' and '65535'. When the current word line is programmed, the threshold voltage of the $k^{th}$ cell connected to the current word line changes from X(k) to vt1(k) due to a coupling occurring in the vertical direction.

'Er' denotes an average erase voltage that is roughly estimated through a trial and an error.

The target threshold voltage X(k) may be calculated by Equations 6 and 7 below.

$$V_{t1}(k)=X(k)+\gamma_b \cdot \max(0,T(k+1)-X(k))+\gamma_b \cdot \max(0,T(k-1)-X(k))$$

and $$T(k)=V_{t1}(k)+\gamma_w \cdot \{T^{next\ line}(k)-[E_r+\gamma_w \cdot (V_{t1}(k)-E_r)]\},$$

wherein 'k' denotes a physical location of a cell in a word line. That is, (k+1) and (k−1) denote the physical locations of neighboring cells at the left and right sides of the $k^{th}$ cell, respectively.

Equation 6 represents a case in which the threshold voltage of the $k^{th}$ cell connected to the current word line increases due to a coupling between bit lines while the current word line is programmed.

While a $(k+1)^{th}$ cell and a $(k-1)^{th}$ cell connected to the current word line are programmed, the threshold voltage of the $k^{th}$ cell increases. In this case, a degree to which the threshold voltage of the $k^{th}$ cell increases due to the $(k+1)^{th}$ cell is ($\gamma b*\max\{0, X(k+1)-X(k)\}$). Such a coupling is referred to as a first coupling.

However, while the subsequent word line is programmed, the threshold voltages of the $(k+1)^{th}$ cell and the $(k-1)^{th}$ cell increase due to a coupling between word lines. As the threshold voltages of the $(k+1)^{th}$ cell and the $(k-1)^{th}$ cell increase, the threshold voltage of the $k^{th}$ cell also increases. Such a coupling is referred to as a second coupling. By replacing 'X(k+1)' with 'T(k+1)' and 'X(k−1)' with 'T(k−1)', the effect of the second coupling may be reflected in Equation 6.

Equation 7 represents a case in which the threshold voltage of the $k^{th}$ cell connected to the current word line increases due to a coupling between word lines when the subsequent word line is programmed.

It is assumed that all of cells that are not programmed have the same threshold voltage. The same threshold voltage is referred to as an average erase voltage Er. When the current word line is programmed, the threshold voltage of the $k^{th}$ cell connected to the subsequent word line changes from the average erase voltage Er to (Er+$\gamma$w*(Vt1(k)−Er)) due to a coupling between word lines. Then, when the subsequent word line is programmed, the threshold voltage of the $k^{th}$ cell connected to the subsequent word line increases to $T^{next\ line}$(k). Thus, an increase in the threshold voltage of the $k^{th}$ cell connected to the current word line due to a coupling between word lines is ($\gamma$w*($T^{next\ line}$(k)−(Er+$\gamma$w*(Vt1(k)−Er))).

During the programming of the subsequent word line, the parameters included in the above formula change. Thus, calculation of Equations 6 and 7 may be performed according to an offline method. In other words, while a word line preceding the current word line is programmed, calculation of the first target programming voltage X(k) of the current word line and calculation of the number of extra pulses Nextra may be performed in parallel. In this case, a total programming time is not increased due to the periods of the calculations.

The open loop programming described above may be used as a coarse programming method and non-open loop programming may then be performed. Otherwise, the open loop programming may be used as a fine programming method.

Figure 10:
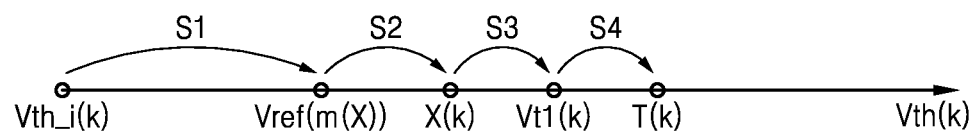
FIG. 10 is a conceptual diagram illustrating in one example the variation of a threshold voltage for a multi-level memory cell that may be used in an embodiment of the inventive concept.

FIG. 10 illustrates the variation in the threshold voltage of a memory cell according to an embodiment of the inventive concept. Referring to FIG. 10, 'Vth(k)' denotes a threshold voltage of a $k^{th}$ cell connected to a current word line, and 'Vth_i(k)' denotes an initial threshold voltage of the $k^{th}$ cell.

A first target programming voltage X(k) used to program the $k^{th}$ cell according to open loop programming is set to be lower than a second target programming voltage T(k) of the $k^{th}$ cell after programming of a memory cell array is completed, in consideration of a voltage increase due to the coupling effect.

Until the threshold voltage of the $k^{th}$ cell becomes equal to or greater than a target verification voltage Vref(m(X)), the threshold voltage of the $k^{th}$ cell is verified by supplying an ISPP pulse the $k^{th}$ cell and applying a plurality of verification voltages are applied to the $k^{th}$ cell (S1). Operation S1 corresponds to operation S305 of FIG. 7.

When the threshold voltage of the $k^{th}$ cell is equal to or greater than the target verification voltage Vref(m(X)), the ISPP pulse is additionally supplied to the $k^{th}$ cell a number of times corresponding to the number of extra pulses Nextra, thereby increasing the threshold voltage of the $k^{th}$ cell to the first target programming voltage X(k) (S2). Operation S2 corresponds to operation S307 of FIG. 7.

Then, the $k^{th}$ cell is set to be in an inhibit state, and the other cells connected to the current word line are programmed. In this case, the threshold voltage of the $k^{th}$ cell changes from X(k) to vt1(k) due to a coupling occurring in a horizontal direction (S3). Then, a subsequent word line is programmed. In this case, the threshold voltage of the $k^{th}$ cell changes from vt1(k) to T(k) due to a coupling occurring in a vertical direction (S4).

A case in which a memory cell is programmed only once to a final target programming voltage T(k) by setting the second target programming voltage T(k) to be a threshold voltage of the memory cell after programming of a memory cell array is completed, has been described above. In this case, the programming method described above is performed once with respect to each of word lines. However, the inventive concept is not limited thereto, and the memory cell may be programmed several times.

For example, it is assumed that the memory cell is an MLC and may thus have an erase state E and a plurality of programmed states P1, P2, and P3. When a $k^{th}$ cell connected to a current word line is programmed to the programmed state P3, the $k^{th}$ cell may be programmed only once by setting the second target programming voltage T(k) to be a voltage of the programmed state P3. However, the $k^{th}$ cell connected to the current word line may be programmed by setting the second target programming voltage T(k) to be a voltage of the programmed state P2, a subsequent word line may be programmed, and may be programmed again by setting the second target programming voltage T(k) to be a voltage of the programmed state P3. In the above embodiments, open loop programming is used to program a cell to all of programmed states. However, open loop programming may be used to program a cell to some of the programmed states, and non-open loop programming may be used to program the cell to the other programmed states.

Referring back to FIG. 5, during programming of a cell to the programmed state P6 or P7, when open loop programming is used, the verification voltage V5 may be set to be the target verification voltage Vref(m(X)) and the ISPP pulse may be additionally supplied to the cell a number of times corresponding to the number of extra pulses Nextra when a threshold voltage of the cell is equal to or greater than the verification voltage V5. In this case, the threshold voltage of the memory cell is verified only while the threshold voltage of the memory cell is less than the verification voltage V5, and is may not verified when the threshold voltage of the memory cell is equal to or greater than the verification voltage V5. However, after the threshold voltage of the cell is equal to or greater than the verification voltage V5, the threshold voltage of the other cells may be verified until the threshold voltage of other cells are equal to or above V5.

When the non-open loop programming is used, the number of extra pulses Nextra is not predicted and the threshold voltage of the cell should thus be verified until the threshold voltage becomes equal to or greater than the verification voltage V6, when the cell is programmed to the programmed state P6. That is, the verification voltage V6 should be used as a verification voltage. In contrast, when open loop programming according to an embodiment of the inventive concept is used, the size of the verification voltage set S1 may be reduced by predicting the number of extra pulses Nextra, thereby reducing a time period needed to verify the cell.

Alternatively, open loop programming may be used when a cell is programmed, for example, to the programmed states P1 to P6 and non-open loop programming may be used when the cell is programmed to the programmed state P7. In this case, by setting the first target programming voltage X(k) and the target verification voltage Vref(m(X)) to be the verification voltage V7 and setting the number of extra pulses Nextra to be '0', the cell may be programmed to the programmed state P7 according to non-open loop programming.

Alternatively, one can perform open loop writing using same number or even more verification voltages than the number of programming states. Open loop writing can be used to improve writing time, but also can be used to improve performance without improving the writing time. Also one can use more verification voltages than programming states and still improve writing time by performing the verification once every second ISPP pulse, instead of performing verification every ISPP pulse as in FIG. 6 (i.e. reducing verification time by performing them every second ISPP pulse). Another option to improve writing speed is to increase the ISPP Vpgm step. A larger ISPP step allows faster program operations (i.e., the memory cell voltage increases faster due to the higher voltage applied to the control gate).

Figure 11:
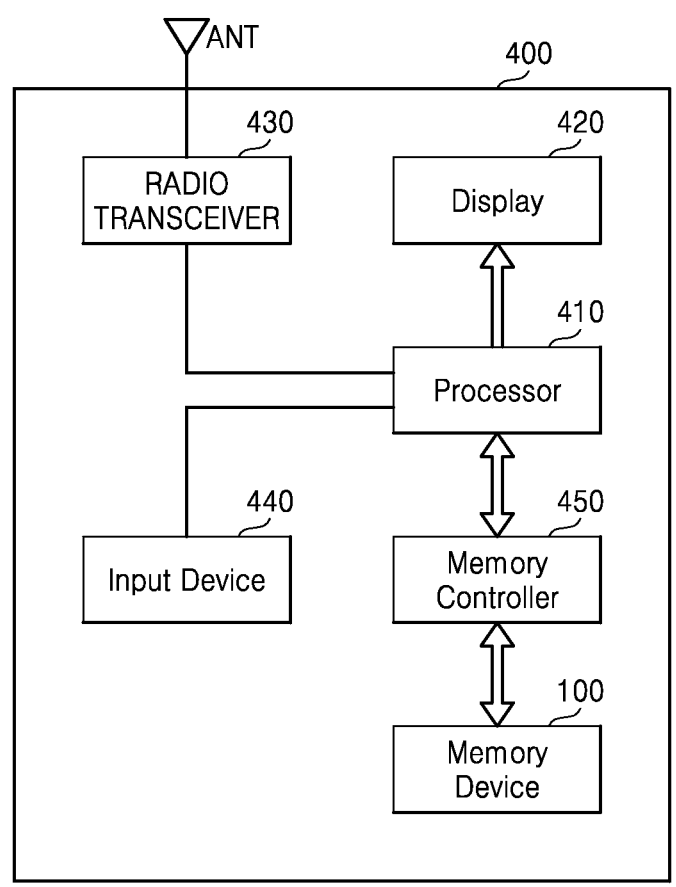
FIGS. 11, 12, 13, 14 and 15 are respective block diagrams illustrating various memory systems that may include one or more non-volatile memory devices such as the one shown in FIG. 2 according to embodiments of the inventive concept.

FIG. 11 is a block diagram of a memory system including the non-volatile memory device illustrated in FIG. 2 according to some embodiments of the inventive concept. Referring to FIGS. 2 and 11, the memory system 400 may be implemented as a cellular phone, a smart phone, a tablet personal computer (PC), a personal digital assistant (PDA) or a radio communication system.

The memory system 400 includes the non-volatile memory device 100 and a memory controller 450 controlling the operations of the non-volatile memory device 100. The memory controller 450 may control the data access operations, e.g., a program operation, an erase operation, and a read operation, of the non-volatile memory device 10 according to the control of a processor 410.

The page data programmed in the non-volatile memory device 100 may be displayed through a display 420 according to the control of the processor 410 and/or the memory controller 450.

A radio transceiver 430 transmits or receives radio signals through an antenna ANT. The radio transceiver 430 may convert radio signals received through the antenna ANT into signals that can be processed by the processor 410. Accordingly, the processor 410 may process the signals output from the radio transceiver 430 and transmit the processed signals to the memory controller 450 or the display 420. The memory controller 450 may program the signals processed by the processor 410 to the non-volatile memory device 100. The radio transceiver 430 may also convert signals output from the processor 410 into radio signals and outputs the radio signals to an external device through the antenna ANT.

An input device 440 enables control signals for controlling the operation of the processor 410 or data to be processed by the processor 410 to be input to the memory system 400. The input device 440 may be implemented by a pointing device such as a touch pad or a computer mouse, a keypad, or a keyboard.

The processor 410 may control the operation of the display 420 to display data output from the memory controller 450, data output from the radio transceiver 430, or data output from the input device 440. The memory controller 450, which controls the operations of the non-volatile memory device 100, may be implemented as a part of the processor 410 or as a separate chip.

Figure 12:
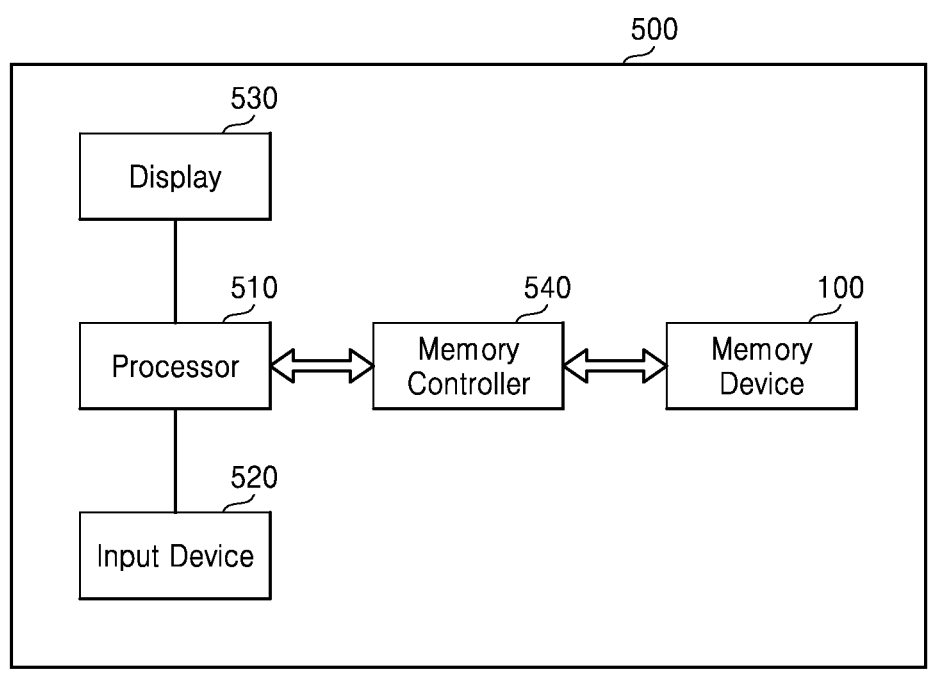

FIG. 12 is a block diagram of a memory system including the non-volatile memory device illustrated in FIG. 2 according to other embodiments of the inventive concept. The memory system 500 may be implemented as a personal computer (PC), a tablet PC, a netbook, an e-reader, a personal digital assistant (PDA), a portable multimedia player (PMP), an MP3 player, or an MP4 player.

The memory system 500 includes the non-volatile memory device 100 and a memory controller 540 controlling the data processing operations of the non-volatile memory device 100. A processor 510 may display data stored in the non-volatile memory device 100 through a display 230 according to data input through an input device 520. The input device 520 may be implemented by a pointing device such as a touch pad or a computer mouse, a keypad, or a keyboard.

The processor 510 may control the overall operation of the memory system 500 and the operations of the memory controller 540. The memory controller 540, which may control the operations of the non-volatile memory device 100, may be implemented as a part of the processor 510 or as a separate chip.

Figure 13:
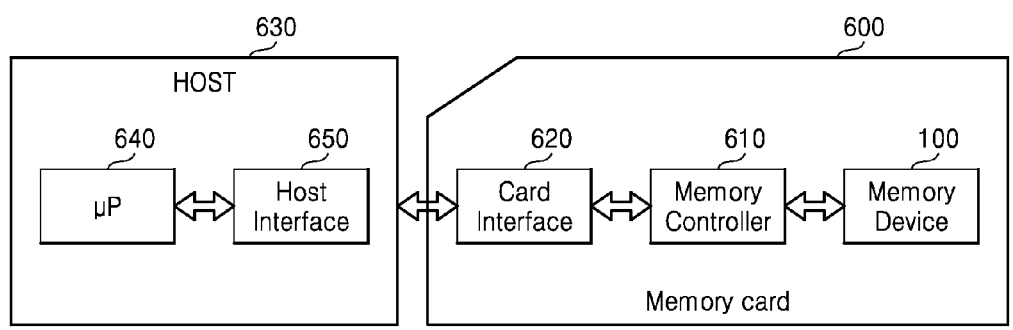

FIG. 13 is a block diagram of a memory system including the non-volatile memory device illustrated in FIG. 2 according to further embodiments of the inventive concept. The memory system 600 may be implemented as a memory card or a smart card. The memory system 600 includes the non-volatile memory device 100, a memory controller 610, and a card interface 620.

The memory controller 610 may control data exchange between the non-volatile memory device 100 and the card interface 620. The card interface 620 may be a secure digital (SD) card interface or a multi-media card (MMC) interface, but the inventive concept is not restricted to the current embodiments.

The card interface 620 may interface a host 630 and the memory controller 610 for data exchange according to a protocol of the host 630. The card interface 620 may support a universal serial bus (USB) protocol and an interchip (IC)-USB protocol. Here, the card interface 620 may indicate a hardware supporting a protocol used by the host 630, a software installed in the hardware, or a signal transmission mode.

When the memory system 600 is connected with the host 630 such as a PC, a tablet PC, a digital camera, a digital audio player, a cellular phone, a console video game hardware, or a digital set-top box, a host interface 650 of the host 630 may perform data communication with the non-volatile memory device 100 through the card interface 620 and the memory controller 610 according to the control of a microprocessor 640.

Figure 14:
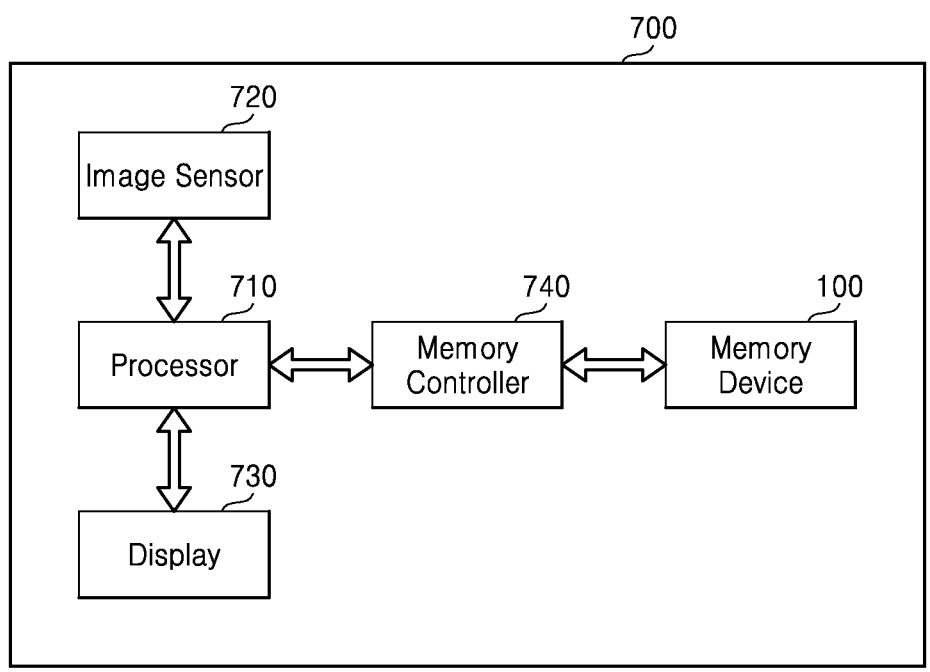

FIG. 14 is a block diagram of a memory system including the non-volatile memory device illustrated in FIG. 2 according to other embodiments of the inventive concept. The memory system 700 may be implemented as an image processor like a digital camera, a cellular phone equipped with a digital camera, a smart phone equipped with a digital camera, or a tablet PC equipped with a digital camera.

The memory system 700 includes the non-volatile memory device 100 and a memory controller 740 controlling the data processing operations, such as a program operation, an erase operation, and a read operation, of the non-volatile memory device 100. An image sensor 720 included in the memory system 700 converts optical images into digital signals and outputs the digital signals to a processor 710 or the memory controller 740. The digital signals may be controlled by the processor 710 to be displayed through a display 730 or stored in the non-volatile memory device 100 through the memory controller 740.

Data stored in the non-volatile memory device 100 may be displayed through the display 730 according to the control of the processor 710 or the memory controller 740. The memory controller 740, which may control the operations of the non-volatile memory device 100, may be implemented as a part of the processor 710 or as a separate chip.

Figure 15:
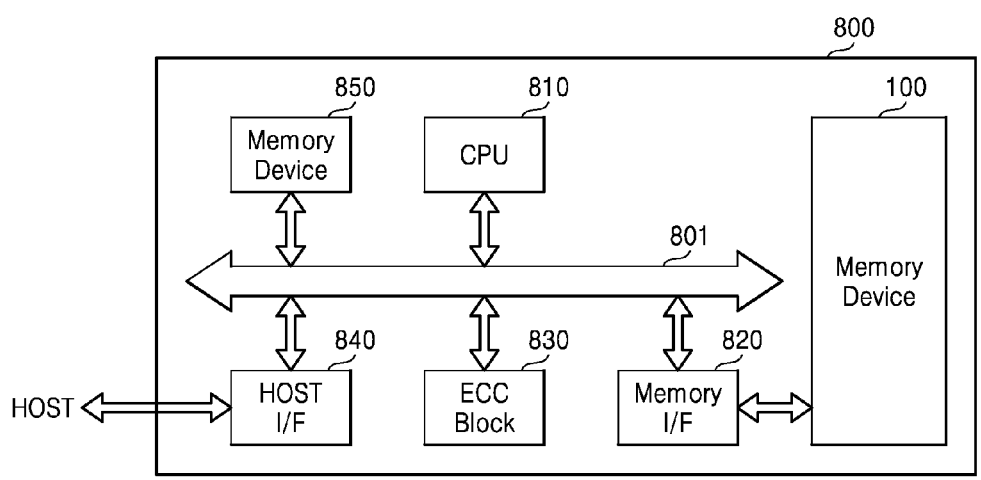

FIG. 15 is a block diagram of a memory system including the non-volatile memory device illustrated in FIG. 2 according to yet other embodiments of the inventive concept. The memory system 800 includes the non-volatile memory device 100 and a central processing unit (CPU) 810 controlling the operations of the non-volatile memory device 100.

The memory system 800 also includes a memory device 850 that may be used an operation memory of the CPU 810. The memory device 850 may be implemented by a non-volatile memory like read-only memory (ROM) or a volatile memory like static random access memory (SRAM). A host connected with the memory system 800 may perform data communication with the non-volatile memory device 100 through a memory interface 820 and a host interface 840.

An error correction code (ECC) block 830 is controlled by the CPU 810 to detect an error bit included in data output from the non-volatile memory device 100 through the memory interface 820, correct the error bit, and transmit the error-corrected data to the host through the host interface 840. The CPU 810 may control data communication among the memory interface 820, the ECC block 830, the host interface 840, and the memory device 850 through a bus 801. The memory system 800 may be implemented as a flash memory drive, a USB memory drive, an IC-USB memory drive, or a memory stick.

Figure 16:
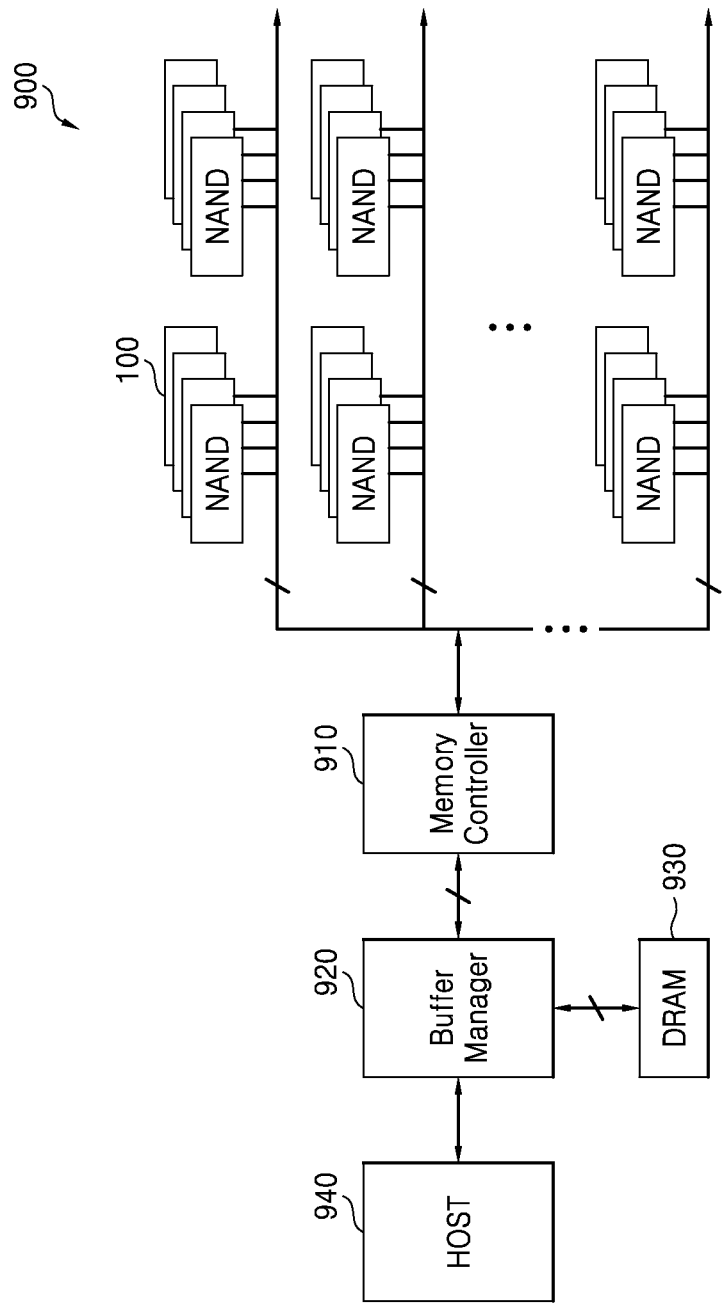
FIG. 16 is a block diagram illustrating a memory system that may include one or more non-volatile memory devices such as the one illustrated in FIG. 2 according to other embodiments of the inventive concept.

FIG. 16 is a block diagram of a memory system including the non-volatile memory device illustrated in FIG. 2 according to still other embodiments of the inventive concept. The memory system 900 may be implemented as a data storage system like a solid state drive (SSD).

The memory system 900 includes a plurality of non-volatile memory devices 100, a memory controller 910 controlling the data processing operations of the non-volatile memory devices 100, a volatile memory device 930 like a dynamic random access memory (DRAM), and a buffer manager 920 controlling data transferred between the memory controller 910 and a host 940 to be stored in the volatile memory device 930.

Figure 17:
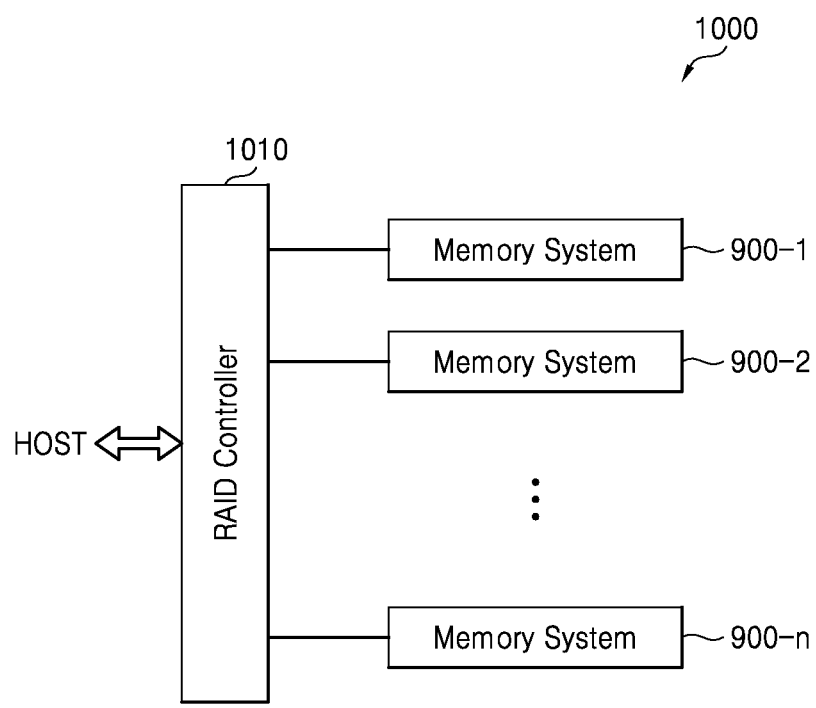
FIG. 17 is a block diagram further illustrating the data processor 1000 of FIG. 16.

FIG. 17 is a block diagram of a data processor including the memory system illustrated in FIG. 16. Referring to FIGS. 16 and 17, the data processor 1000 may be implemented as a redundant array of independent disks (RAID) system. The data processor 1000 includes a RAID controller 1010 and a plurality of memory systems 900-1 through 900-n where "n" is a natural number.

Each of the memory systems 900-1 through 900-n may be the memory system 900 illustrated in FIG. 16. The memory systems 900-1 through 900-*n* may form a RAID array. The data processor 1000 may be a PC or an SSD.

During a program operation, the RAID controller 1010 may transmit program data output from a host to at least one of the memory systems 900-1 through 900-*n* according to a RAID level in response to a program command received from the host. During a read operation, the RAID controller 1010 may transmit to the host data read from at least one of the memory systems 900-1 through 900-*n* in response to a read command received from the host.

The present general inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

According to the above embodiments of the inventive concept, a small number of verification voltages may be used and pre-equalization may be performed, compared to a conventional programming method, thereby minimizing a programming time period and a bit error rate (BER).

While the inventive concept has been particularly shown and described with reference to exemplary embodiments thereof, it will be understood that various changes in form and details may be made therein without departing from the scope of the following claims.

What is claimed is:

1. A method of programming a non-volatile memory device, the method comprising:
    defining a set of verification voltages for a memory cell having a number of programmable data states, wherein a number of verification voltages in the set of verification voltages is less than a number of the programmable data states;
    setting a maximum verification voltage among verification voltages that are less than or equal to a first target programming voltage to be a target verification voltage;
    calculating a number of extra pulses based on the target verification voltage and the first target programming voltage;
    verifying whether a threshold voltage of the memory cell is equal to or greater than the target verification voltage by applying an incremental step pulse program (ISPP) pulse to the memory cell and then applying at least one verification voltage in the set of verification voltages to the memory cell;
    further applying the ISPP pulse to the memory cell a number of times equal to the number of extra pulses when the threshold voltage is verified to be equal to or greater than the target verification voltage; and
    after further applying the ISPP pulse to the memory cell the number of times equal to the number of extra pulses, setting the memory cell in an inhibit state.

2. The method of claim 1, wherein the setting of the maximum verification voltage as the target verification voltage and the calculating of the number of extra pulses are performed by a memory controller connected to the non-volatile memory device.

3. The method of claim 2, wherein the verifying of whether the threshold voltage of the memory cell is equal to or greater than the target verification voltage, and the further applying of the ISPP pulse to the memory cell the number of times corresponding to the number of extra pulses are performed by the non-volatile memory device.

4. The method of claim 3, further comprising:
    communicating information regarding the target verification voltage and the number of extra pulses from the memory controller to the non-volatile memory device.

5. The method of claim 2, wherein the number of extra pulses is calculated using the equation $$N_{extra} = \text{round}\left(\frac{X - V_{ref}(m(X))}{\alpha}\right),$$

wherein 'X' denotes the first target programming voltage, '$V_{ref}(m(X))$' denotes the target verification voltage, and 'a' denotes an inclination of the threshold voltage of the memory cell after the ISPP pulse is supplied.

6. The method of claim 5, wherein the first target programming voltage is calculated using the equations:

$$V_{t1}(k)=X(k)+\gamma_b \cdot \max(0,T(k+1)-X(k))+\gamma_b \cdot \max(0,T(k-1)-X(k)),$$

and $$T(k)=V_{t1}(k)+\gamma_w \cdot \{T^{next\,line}(k)-[E_r+\gamma_w \cdot (V_{t1}(k)-E_r)]\},$$

wherein the memory cell is a $k^{th}$ memory cell connected to the word line to which the memory cell belongs, '$\gamma_b$' denotes the coupling coefficient between bit lines, '$\gamma_w$' denotes the coupling coefficient between word lines, 'T(k)' denotes a target threshold voltage of the memory cell after programming of a memory cell array is completed, '$T^{next\,line}(k)$' denotes a target threshold voltage of a $k^{th}$ memory cell connected to a subsequent word line adjacent to the word line after the programming of the memory cell array is completed, 'Vt1(*k*)' denotes a target threshold voltage of the memory cell after the word line is programmed and before the subsequent word line is programmed, 'X(k)' denotes a target threshold voltage of the memory cell before the word line is programmed, and 'Er' denotes an average erase voltage.

7. The method of claim 1, wherein the calculating of the number of extra pulses is performed, at least in part, in parallel with programming of a word line preceding a word line to which the memory cell belongs.

8. The method of claim 1, wherein the first target programming voltage is less than a second target programming voltage that is preset based on a coupling coefficient between word lines and a coupling coefficient between bit lines.

9. A non-volatile memory device comprising:
    a memory cell array including a plurality of multi-level memory cells (MLC) capable of being programmed to a number of programmable data states; and
    an access circuit that receives information regarding a target verification voltage and a number of extra pulses during a program operation,
    wherein the access circuit in response to the target verification voltage and the number of extra pulses, (1) verifies whether a threshold voltage of each MLC is equal to or greater than the target verification voltage by supplying an incremental step pulse program (ISPP) pulse, (2) applies at least one verification voltage among a set of verification voltages to each MLC, (3) further applies the ISPP pulse to each MLC a number of times equal to the number of extra pulses when the threshold voltage is verified to be equal to or greater than the target verification voltage, and (4) after further applying the ISSP pulse to each MLC the number of times equal to the number of extra pulses, setting the MLC to an inhibit state.

10. The non-volatile memory device of claim 9, wherein the access circuit comprises page buffers respectively connected to bit lines of the memory cell array, wherein each of the page buffers comprises:
a plurality of data storing latches that store data corresponding to the target verification voltage; and
a plurality of extra pulse number storing latches that store the number of extra pulses.

11. The non-volatile memory device of claim 10, wherein the number of the plurality of data storing latches included in each of the page buffers is 'ceil($\log_2(M)$)', and the number of the plurality of extra pulse number storing latches is 'ceil($\log_2(K)$)', wherein 'M' denotes a number of programmed states that each of the plurality of memory cells may have, and 'K' denotes a size of a set of values that the number of extra pulses may have.

12. The non-volatile memory device of claim 9, wherein the access circuit comprises page buffers respectively connected to bit lines of the memory cell array, each of the page buffers including a plurality of latches that store data values based on the target verification voltage and the number of extra pulses.

13. The non-volatile memory device of claim 12, wherein a number of the plurality of latches included in each of the page buffers is 'ceil($\log_2(LK)$)', where 'L' denotes the number of the plurality of verification voltages, and 'K' denotes a size of a set of values that the number of extra pulses may have.

14. The non-volatile memory device of claim 12, wherein a number of the plurality of latches included in each of the page buffers is 'ceil($\log_2(Z)$)', where 'Z' denotes a number of cases of each of the target verification voltage and the number of extra pulses, and the verification voltage set minimizes Z.

15. The non-volatile memory device of claim 14, wherein one of the memory cell array and access circuit stores information regarding combinations of the number of cases of the target verification voltage and the number of cases of the number of extra pulses.

16. A non-volatile memory system comprising:
a memory controller controlling the operation of a non-volatile memory device during a program operation,
wherein the memory controller is configured to;
define a set of verification voltages for multi-level memory cells (MLC) of the non-volatile memory device having a number of programmable data states, such that a number of verification voltages in the set of verification voltages is less than the number of the programmable data states,
set a maximum verification voltage among the set of verification voltages that are less than or equal to a first target programming voltage to be a target verification voltage,
calculate a number of extra pulses based on the target verification voltage and the first target programming voltage, and
communicate information regarding the target verification voltage and the number of extra pulses to the non-volatile memory device; and
the non-volatile memory device is configured to;
verify whether a threshold voltage of the MLC is equal to or greater than the target verification voltage by applying an incremental step pulse program (ISPP) pulse to the memory cell and then applying at least one verification voltage selected from the set of verification voltages to the MLC;
further apply the ISPP pulse to the memory cell a number of times equal to the number of extra pulses when the threshold voltage is verified to be equal to or greater than the target verification voltage; and
after further applying the ISPP pulse to the memory cell the number of times equal to the number of extra pulses, set the memory cell to an inhibit state.

17. The non-volatile memory system of claim 16, wherein after the non-volatile memory device is a flash memory.

18. The non-volatile memory system of claim 17, wherein the flash memory has a three-dimensional (3D) memory cell array.

* * * * *